(12) United States Patent
Boerstler et al.

(10) Patent No.: US 7,265,600 B2
(45) Date of Patent: Sep. 4, 2007

(54) LEVEL SHIFTER SYSTEM AND METHOD TO MINIMIZE DUTY CYCLE ERROR DUE TO VOLTAGE DIFFERENCES ACROSS POWER DOMAINS

(75) Inventors: David W. Boerstler, Round Rock, TX (US); Eskinder Hailu, Austin, TX (US); Kazuhiko Miki, Round Rock, TX (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 11/242,670

(22) Filed: Oct. 4, 2005

(65) Prior Publication Data

US 2007/0075764 A1 Apr. 5, 2007

(51) Int. Cl.
*H03L 5/00* (2006.01)
(52) U.S. Cl. ................................. 327/333; 326/80
(58) Field of Classification Search .................. None
See application file for complete search history.

(56) References Cited

U.S. PATENT DOCUMENTS

| | | | | |
|---|---|---|---|---|
| 4,663,701 A * | 5/1987 | Stotts | ........................... | 363/60 |
| 5,153,451 A | 10/1992 | Yamamura et al. | | |
| 5,399,915 A * | 3/1995 | Yahata | ........................ | 327/108 |
| 5,450,357 A | 9/1995 | Coffman | | |
| 5,627,489 A | 5/1997 | Jochum | | |
| 5,705,946 A * | 1/1998 | Yin | ............................ | 327/333 |
| 5,900,750 A * | 5/1999 | Schmitt | ...................... | 327/108 |
| 6,031,413 A * | 2/2000 | Mizoguchi | ................... | 327/538 |
| 6,359,814 B1 * | 3/2002 | Sundaram et al. | ..... | 365/189.09 |
| 6,442,082 B2 * | 8/2002 | Taura et al. | ........... | 365/189.11 |
| 6,477,092 B2 * | 11/2002 | Takano | .................. | 365/189.11 |
| 6,515,512 B2 * | 2/2003 | Chen | ............................ | 326/62 |
| 6,542,144 B2 * | 4/2003 | Kogure et al. | ................. | 345/98 |
| 6,683,485 B1 * | 1/2004 | Wert | .......................... | 327/333 |
| 6,768,368 B2 | 7/2004 | Kaneko et al. | | |
| 6,788,125 B1 | 9/2004 | Tomsio | | |
| 6,806,734 B2 * | 10/2004 | Cairns et al. | .................. | 326/68 |

(Continued)

FOREIGN PATENT DOCUMENTS

EP 0817386 A1 1/1998

(Continued)

*Primary Examiner*—Tuan T. Lam
*Assistant Examiner*—William Hernandez
(74) *Attorney, Agent, or Firm*—Stephen J. Walder, Jr.; Diana R. Gerhardt

(57) ABSTRACT

The present invention provides for a system comprising a first stable voltage module configured to receive a first power supply from a first power supply domain and to generate a first stable voltage in response to the received first power supply. A second stable voltage module is configured to receive a second power supply from a second power supply domain and to generate a second stable voltage in response to the received second power supply. A first set of resistors is coupled to the first stable voltage module and configured in parallel. A second set of resistors is coupled to the second stable voltage module and configured in parallel. A set of capacitors is coupled in parallel to the first set of resistors and the second set of resistors and a plurality of level shifters are coupled to the second set of resistors.

18 Claims, 3 Drawing Sheets

U.S. PATENT DOCUMENTS

| | | |
|---|---|---|
| 6,819,159 B1 | 11/2004 | Lencioni |
| 6,870,407 B2 * | 3/2005 | Lundberg .................. 327/112 |
| 2002/0083352 A1 | 6/2002 | Fujimoto et al. |
| 2004/0217798 A1 | 11/2004 | Lencioni |

FOREIGN PATENT DOCUMENTS

| | | |
|---|---|---|
| JP | 2002190730 A2 | 5/2002 |

\* cited by examiner

LEVEL SHIFTER SYSTEM AND METHOD TO MINIMIZE DUTY CYCLE ERROR DUE TO VOLTAGE DIFFERENCES ACROSS POWER DOMAINS

TECHNICAL FIELD

The present invention relates generally to the field of circuit design and operation-and, more particularly, to a level shifter system and method to minimize duty cycle error due to voltage differences across power domains.

BACKGROUND

Level shifters are integral components of any circuit that operates from different power supply boundaries. Level shifters act as interfaces between different power supply domains to send and receive signals across these boundaries. Depending in part on the voltage mismatch between two power domains, circuit design that reduces duty cycle errors, or duty cycle distortion, becomes increasingly important.

As one skilled in the art will understand, duty cycle is the ratio of the average power to the peak pulse power of a signal, or the ratio of the pulse width to the pulse repetition interval. That is, duty cycle represents the ratio of "on" or logic high pulses to the total operating time or designated signal interval, including "off" or logic low pulses. Thus, duty cycle distortion is a deviation in duty cycle from the intended duty cycle, in particular a variation in the transition from logic high to logic low and/or logic low to logic high. In digital systems, duty cycle distortion is the difference between the duty cycle between a 1 bit and a 0 bit.

The importance of circuit design that accounts for duty cycle distortion significantly increases as the difference between the power supply voltages between two power supply domains gets larger. Additionally, reducing duty cycle distortion has become an even more important issue as chip operating frequencies enter multiple giga-hertz ranges. This design consideration is even more pronounced in analog circuits, which are strongly influenced by process, voltage, and temperature ("PVT") variations.

Therefore, there is a need for a level shifter system and/or method that minimizes duty cycle distortion due to voltage differences across power domains that addresses at least some of the problems and disadvantages associated with conventional systems and methods.

SUMMARY

The present invention provides for a system comprising a first stable voltage module configured to receive a first power supply from a first power supply domain and to generate a first stable voltage in response to the received first power supply. A second stable voltage module is configured to receive a second power supply from a second power supply domain and to generate a second stable voltage in response to the received second power supply. A first set of resistors is coupled to the first stable voltage module and configured in parallel. A second set of resistors is coupled to the second stable voltage module and configured in parallel. A set of capacitors is coupled in parallel to the first set of resistors and the second set of resistors and a plurality of level shifters are coupled to the second set of resistors.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

Figure 1:
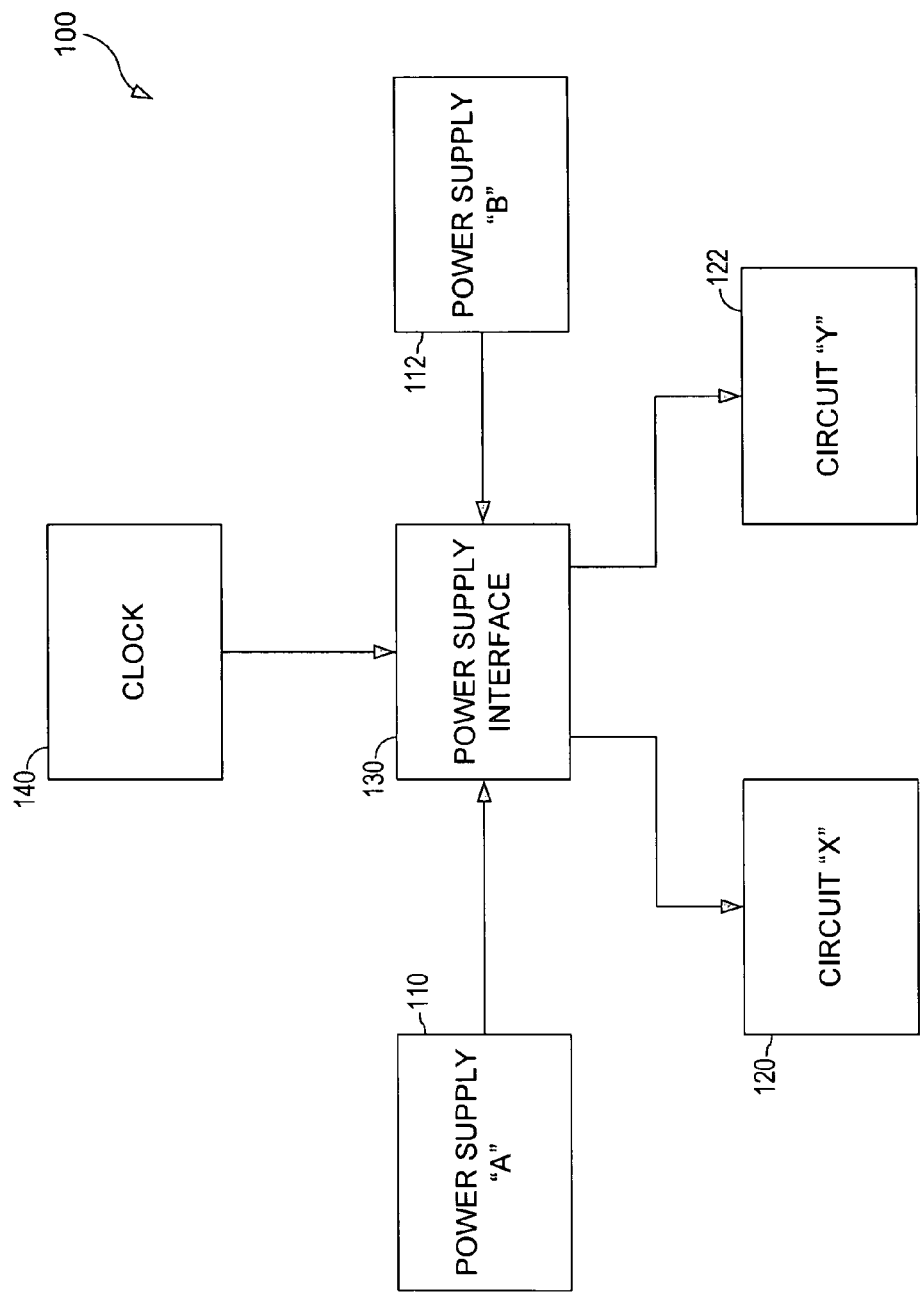
FIG. 1 is a block diagram depicting a computer system.

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or in some combinations thereof. In a preferred embodiment, however, the functions are performed by a processor such as a computer or an electronic data processor in accordance with code such as computer program code, software, and/or integrated circuits that are coded to perform such functions, unless indicated otherwise.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

FIG. 1 depicts a computer system 100, illustrating an example system configuration with two power supply domains. Computer system 100 includes a power supply "A" 110, a power supply "B" 112, a circuit "X" 120, a circuit "Y" 122, a power supply interface 130 and a clock 140. Power supply "A" 110 is an otherwise conventional power supply and couples to power supply interface 130. Power supply "A" 110 provides power to power supply interface 130 with a certain voltage characteristic "A". Power supply "B" 112 is an otherwise conventional power supply and couples to power supply interface 130. Power supply "B" 112 provides power to power supply interface 130 with a certain voltage characteristic "B". Clock 140 is an otherwise conventional clock and couples to power supply interface 130 to provide a clock signal.

Circuit "X" 120 is any circuit or group of circuits and couples to power supply interface 130. Similarly, circuit "Y" 122 is any circuit or group of circuits and couples to power supply interface 130. Generally, circuit "X" 120 and circuit "Y" 122 receive power and/or a clock signal at one particular voltage characteristic at any given time, typically either voltage characteristic "A" or voltage characteristic "B." One skilled in the art will understand that circuit "X" 120 and circuit "Y" 122 can operate at a number of different voltages generally, while typically operating at a single particular voltage at any one time.

Generally, power supply interface 130 draws power from power supply "A" 110 and power supply "B" 112 and a clock signal from clock 140, and provides power and/or a clock signal at a particular voltage characteristic to circuit "X" 120 and circuit "Y" 122. In the illustrated embodiment, power supply interface 130 provides a clock signal for transmission to circuit "X" 120 and circuit "Y" 122 in response to a clock signal received from clock 140. In an alternate embodiment, power supply "A" 110 and/or power supply "B" 112 each provide its own clock signal at its associated voltage characteristic.

In the embodiment where power supply interface 130 provides a clock signal in response to a clock signal received from clock 140, power supply interface 130 provides a clock signal in response to the power supply domain voltage characteristic "A" or "B". That is, where circuit "X" 120 and/or circuit "Y" 122 require power at voltage characteristic "A", power supply interface 130 provides a clock signal that oscillates between a low voltage and a voltage represented by voltage characteristic "A". Similarly, where circuit "X" 120 and/or circuit "Y" 122 require power at voltage characteristic "B", power supply interface 130 provides a clock signal that oscillates between a low voltage and a voltage represented by voltage characteristic "B".

Thus, power supply interface 130 can provide power, in the form of a clock signal, to circuit "X" 120 and circuit "Y" 122, at the voltage characteristic required by circuit "X" 120 and/or circuit "Y" 122 at any given time. One skilled in the art will understand that power supply interface 130 can be configured with level shifting circuitry to manage the transition between the power supply "A" domain and the power supply "B" domain. A novel level shifter system that reduces duty cycle distortion through intermediate power supply voltages for intermediate level shifters is presented in FIG. 2.

Figure 2:
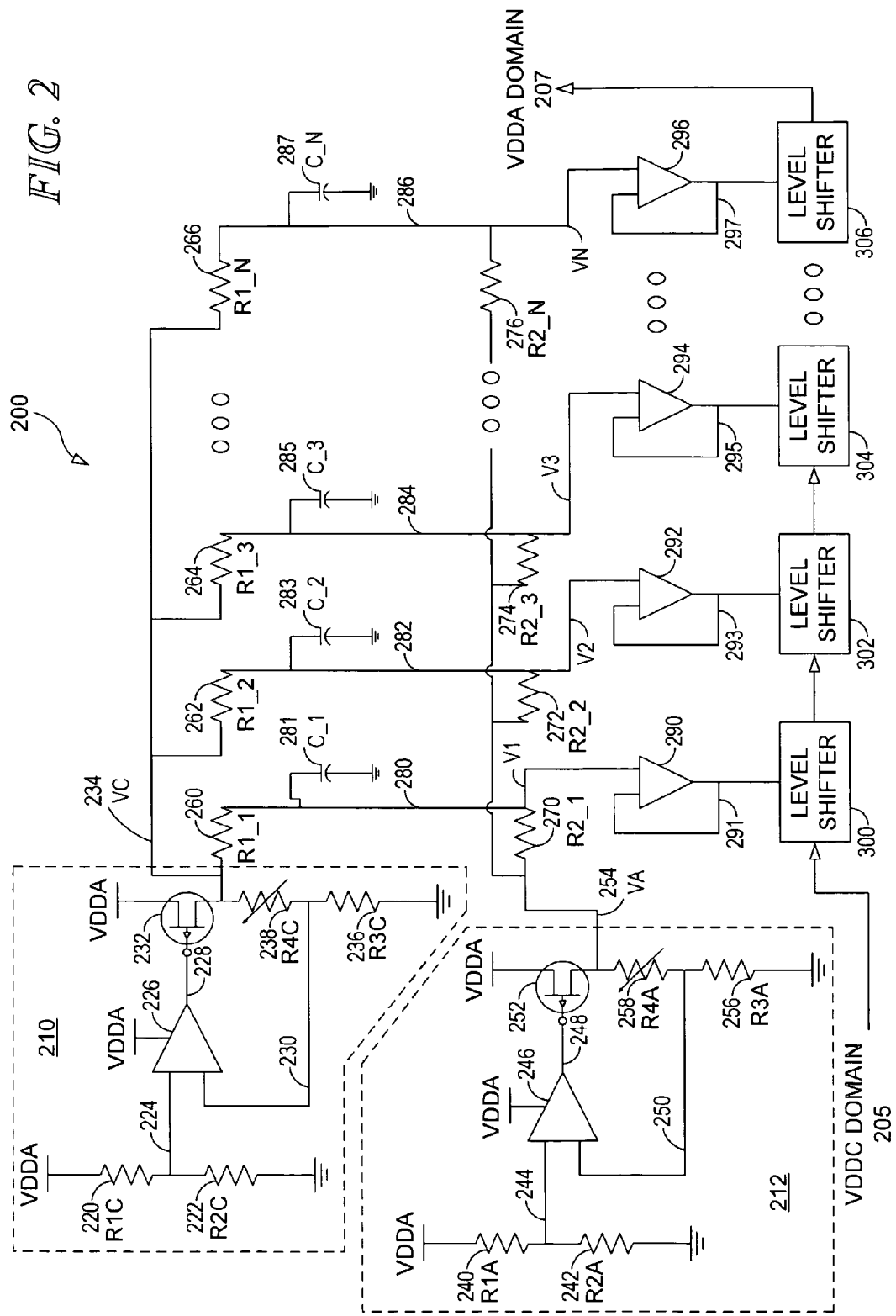
FIG. 2 is a block diagram depicting a detailed implementation of a level shifter circuit.

FIG. 2 depicts level shifter system 200. Generally, level shifter system 200 receives power supply signals with particular voltage characteristics, and generates a power supply signal at a target voltage characteristic, with a series of predetermined intermediate transitions that reduce duty cycle error. In particular, level shifter system 200 receives a "VDDC Domain" power supply signal, VDDC DOMAIN 205 from a first power supply domain, such as, for example power supply "A" 110 of FIG. 1. As described in more detail below, level shifter system 200 generates a "VDDA Domain" power supply signal, VDDA DOMAIN 207.

The illustrated embodiment and following discussion describes the present invention with the assumption that the voltage characteristics of the VDDA Domain are higher than the voltage characteristics of the VDDC Domain. That is, the transition from the VDDC Domain to the VDDA Domain includes an increase in voltage. One skilled in the art will understand that level shifter system 200 can also operate in a system wherein the transition to the target domain includes a decrease in voltage, with minor modifications.

Generally, the plurality of predetermined intermediate voltage levels are set at discrete levels between the voltage of the input power supply domain and the target power supply domain. For ease of illustration, this discussion refers to the input power supply domain voltage as "VDDC" and the target power supply domain voltage as "VDDA." Thus, the plurality of predetermined intermediate voltage levels are set at discrete levels between VDDC and VDDA.

Level shifter system 200 includes stable voltage modules 210 and 212. In the illustrated embodiment, the VDDA power supply drives stable voltage module 210, as described in more detail below. In an alternate embodiment, the VDDA power supply and the VDDC power supply drive stable voltage module 210. Additionally, the VDDA power supply drives stable voltage module 212. Generally, stable voltage modules 210 and 212 each include an operational amplifier, a switch, and a plurality of resistors.

In particular, stable voltage module 210 includes resistors 220 and 222. Resistors 220 and 222 are otherwise conventional resistors and are coupled in series. Resistor 220, "R1C", couples to a fixed potential, VDDA. Resistor 222, "R2C", couples to resistor 220 and to ground.

Resistors 220 and 222 couple to opamp 226. In particular, input 224 of opamp 226 is tied to a point between resistors 220 and 222. Opamp 226 is an otherwise conventional operational amplifier and is tied to the target power supply domain voltage, VDDA. Opamp 226 generates output 228 in response to VDDA, input 224, and feedback 230, as one skilled in the art will understand.

Opamp output 228 is an input to switch 232. Switch 232 couples to opamp 226 and is an otherwise conventional analog switch, such as a transistor. In one embodiment, switch 232 is a p-type field effect transistor (PFET). Switch 232 is tied to VDDA and generates a switch output 234. Switch output 234 is an output of stable voltage module 210.

Switch output 234 also couples to ground through resistors 236 and 238. Resistors 236 and 238 are otherwise conventional resistors and are coupled in series. Resistor 238, "R4C", couples to a switch output 234. Resistor 236, "R3C", couples to resistor 238 and to ground. As depicted, feedback 230 of opamp 226 is tied to a point between resistors 236 and 238.

Generally, resistors 220 "R1C", 222 "R2C", 236 "R3C", and 238 "R4C" can be variable or fixed resistors. In particular, resistors 220 "R1C", 222 "R2C", 236 "R3C", and 238 "R4C" are configured so that switch output 234, "VC" is a stable voltage at the voltage of the initial power supply domain, VDDC. Moreover, resistors 220 "R1C", 222 "R2C", 236 "R3C", and 238 "R4C" can be selected such that switch 232 performs in accordance with desired DC operating conditions, that is, the desired DC current flows through switch 232, as one skilled in the art will understand.

Stable voltage module 212 includes resistors 240 and 242. Resistors 240 and 242 are otherwise conventional resistors and are coupled in series. Resistor 240, "R1A", couples to a fixed potential, VDDA. Resistor 242, "R2A", couples to resistor 240 and to ground.

Resistors 240 and 242 couple to opamp 246. In particular, input 244 of opamp 246 is tied to a point between resistors 240 and 242. Opamp 246 is an otherwise conventional operational amplifier and is tied to the target power supply domain voltage, VDDA. Opamp 246 generates output 248 in response to VDDA, input 244, and feedback 250, as one skilled in the art will understand.

Opamp output 248 is an input to switch 252. Switch 252 couples to opamp 246 and is an otherwise conventional analog switch, such as a transistor. In one embodiment, switch 252 is a p-type field effect transistor (PFET). Switch 252 is tied to VDDA and generates a switch output 254. Switch output 254 is an output of stable voltage module 212.

Switch output 254 also couples to ground through resistors 256 and 258. Resistors 256 and 258 are otherwise conventional resistors and are coupled in series. Resistor 258, "R4A", couples to a switch output 254. Resistor 256, "R3A", couples to resistor 258 and to ground. As depicted, feedback 250 of opamp 246 is tied to a point between resistors 256 and 258.

Generally, resistors 240 "R1A", 242 "R2A", 256 "R3A", and 258 "R4A" can be variable or fixed resistors. In particular, resistors 240 "R1A", 242 "R2A", 256 "R3A", and 258 "R4A" are configured so that switch output 254, "VA" is a stable voltage at the voltage of the target power supply domain, VDDA. Moreover, resistors 240 "R1A", 242 "R2A", 256 "R3A", and 258 "R4A" can be selected such that switch 252 performs in accordance with desired DC operating conditions, that is, the desired DC current flows through switch 252, as one skilled in the art will understand.

In the illustrated embodiment, as described above, the discussion assumes that the target power supply domain voltage, VDDA, is higher than the initial power supply domain voltage, VDDC. Consequently, opamps 226 and 246 and switches 232 and 252 are shown driven off of VDDA. Where VDDC is larger than VDDA, opamps 226 and 246 and switches 232 and 252 are driven off of VDDC. One skilled in the art will understand that the present invention can be configured to operate between any two power supply domains, in either direction, with minor modifications to accommodate design specifications of the particular power supply domains.

More particularly, level shifter system 200 also includes a first set of resistors coupled to stable voltage module 210. In particular, stable voltage module 210 couples to resistor 260 "R1_1". Resistor 260 "R1_1" couples to resistor 262 "R1_2", which couples to resistor 264 "R1_3" and so forth, in parallel to resistor 266 "R1_N," where "N" is the number of resistors. Resistors 260 through 266 are otherwise conventional resistors and can be variable-type resistors or fixed resistors, as one skilled in the art will understand. As described in more detail below, the number of resistors in the first set, in part, determines the number of intermediate voltage levels between the input power supply domain and the target power supply domain.

Level shifter system 200 also includes a second set of resistors coupled to stable voltage module 212. In particular, stable voltage module 212 couples to resistor 270 "R2_1". Resistor 270 "R2_1" couples to resistor 272 "R2_2", which couples to resistor 274 "R2_3" and so forth, in parallel to resistor 276 "R2_N," where "N" is the number of resistors. Resistors 270 through 276 are otherwise conventional resistors and can be variable-type resistors or fixed resistors, as one skilled in the art will understand. As described in more detail below, the number of resistors in the second set of resistors, in part, determines the number of intermediate voltage levels between the input power supply domain and the target power supply domain.

The first set of resistors couples to the second set of resistors in parallel. In particular, resistor 260 couples to resistor 270 through link 280. Resistor 262 couples to resistor 272 through link 282. Similarly, resistor 264 couples to resistor 274 through link 284, and so forth for the one or more resistors between resistors 264 and 266 and resistors 274 and 276. Resistor 266 couples to resistor 276 through link 286. Links 280, 282, 284, through 286 are otherwise conventional electronic connections.

Level shifter system 200 also includes a set of capacitors coupled in parallel to links 280, 282, 284 through 286. In particular, capacitor 281 "C_1" couples to link 280. Capacitor 283 "C_2" couples to link 282. Capacitor 285 "C_3" couples to link 284, and so forth. Capacitor 287 "C_N" couples to link 286. Capacitors 281, 283, 285, through 287 are otherwise conventional capacitors.

In the illustrated embodiment, a plurality of unity gain buffers couple to the output of each of the second set of resistors 270, 272, 274, through 276. In particular, buffer 290 couples to the output of resistor 270, buffer 292 couples to the output of resistor 272, buffer 294 couples to the output of resistor 274, and so forth. Buffer 296 couples to the output of resistor 276. For ease of illustration, the output of each of the second set of resistors 270, 272, 274, through 276 is indicated by "V1", "V2", "V3", through "VN", respectively.

Buffers 290, 292, 294, through 296 are otherwise conventional unity gain buffers, as one skilled in the art will understand. The output of each buffer 290, 292, 294, through 296 is also configured, in part, with a corresponding feedback loop 291, 293, 295, through 297, as one skilled in the art will understand.

Level shifter system 200 also includes a plurality of level shifter circuits coupled in series. In particular, level shifter (LS) 300 couples to buffer 290. In the illustrated embodiment, LS 300 receives input from the VDDC Domain and buffer 290, and generates an output signal at an intermediate power supply level, as described in more detail below.

Similarly, LS 302 couples to and receives input from LS 300 and buffer 292. In response to the received input, LS 302 generates an output signal at an intermediate power supply level, as input to the next level shifter in the series. Thus, one skilled in the art will understand that each level shifter generates one of a series of intermediate voltage-level power supply signals that become the input for the next level shifter in the series.

At the end of the series, LS 306 receives input from the prior level shifter and buffer 296 and generates an output signal at the final power supply level. In the illustrated embodiment, the output of LS 306 is at the VDDA domain voltage characteristic. In an alternate embodiment, LS 306 couples to another level shifter to bring the voltage from VN to VDDA.

In the illustrated embodiment, the output of each of the series of resistors 270, 272, 274, through 276 is coupled to an associated level shifter through a unity gain buffer. In an alternate embodiment, the plurality of buffers 290, 292, 294, through 296 can be omitted. Accordingly, level shifters 300, 302, 304, through 306 can couple directly to the output of resistors 270, 272, 274, through 276, respectively.

One skilled in the art will understand that level shifter system 200 as illustrated provides a plurality of intermediate power supply voltage levels between the input and the target power supplies. For example, as illustrated, stable voltage module 210 generates an output 234 "VC" and stable voltage module 212 generates an output 254 "VA". One skilled in the art will understand that:

$$VC = [R2C/(R1C + R2C)]VDDA + (R4C/R3C)[R2C/(R1C + R2C)]VDDA \quad (1)$$

$$VC = \alpha_C(VDDA) \text{ where } \alpha_C = [R2C/(R1C + R2C)][1 + R4C/R3C] \quad (2)$$

$$VA = [R2A/(R1A + R2A)]VDDA + (R4A/R3A)[R2A/(R1A + R2A)]VDDA \quad (3)$$

$$VA = \alpha_A(VDDA) \text{ where } \alpha_A = [R2A/(R1A + R2A)][1 + R4A/R3A] \quad (4)$$

As VDDC < VDDA, $\alpha_C$ >1, and $\alpha_A$ <1. Also:

$$V1 = [R2\_1/(R1\_1 + R2\_1)]\alpha_C VDDA + [R1\_1/(R1\_1 + R2\_1)]\alpha_A VDDA \quad (5)$$

$$V1 = \beta_{1C}\alpha_C VDDA + \beta_{1A}\alpha_A VDDA \quad (6)$$

Where $\beta_{1C} = [R2\_1/(R1\_1 + R2\_1)]$ and $\beta_{1A} = [R1\_1/(R1\_1 + R2\_1)]$ Similarly, $VN = \beta_{NC}\alpha_C VDDA + \beta_{NA}\alpha_A VDDA \quad (7)$ Where $\beta_{NC} = [R2\_N/(R1\_N + R2\_N)]$ and $\beta_{NA} = [R1\_N/(R1\_N + R2\_N)]$ And $\beta_{NC}\alpha_C VDDA$ >1 and $\beta_{NA}\alpha_A VDDA$ <1.

From equation (7), one skilled in the art will appreciate that level shifter system 200 generates a series of intermediate voltages "VN" that span the range between VDDC and VDDA. Thus, by spreading the transition from VDDC to VDDA over a plurality of intermediate voltages, duty cycle distortion can be reduced.

As shown above, a voltage gradient of the transition from VDDC to VDDA can be described in terms of its slope, which is a function of the number of intermediate voltages in between the initial and target voltages, as embodied by the coefficients $\alpha$ and $\beta$. As one skilled in the art will understand, the coefficients $\alpha$ and $\beta$ are determined by the various resistors employed in level shifter system 200. As described above, the various resistors can be variable-type, or "trimmable" resistors. Accordingly, where level shifter system 200 includes such trimmable resistors, the duty cycle associated with any particular intermediate transition can be adjusted during the manufacturing process, which increases the flexibility of the system to meet end-user specifications.

Similarly, as described above, the plurality of unity gain buffers can be omitted. However, buffers 290, 292, 294, through 296 provide certain advantages. For example, the foregoing analysis neglects DC current consumption by the receivers. This DC current consumption results in voltages "VN" that are smaller than those predicted by equation (7). However, including the plurality of unity gain buffers can reduce this difference, or "droop." As illustrated, level shifter system 200 is described exactly by equation (7). Moreover, the addition of the plurality of unity gain buffers includes that further advantage of negligible power dissipation in generating the intermediate voltages. Thus, the preferred embodiment of the present invention includes the plurality of unity gain buffers as illustrated.

The circuits as described above are part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (for example, by providing a copy of the storage medium storing the design) or electronically (for example, through the Internet) to such entities, directly or indirectly. The stored design is then converted into the appropriate format (for example, GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multi-chip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 3:
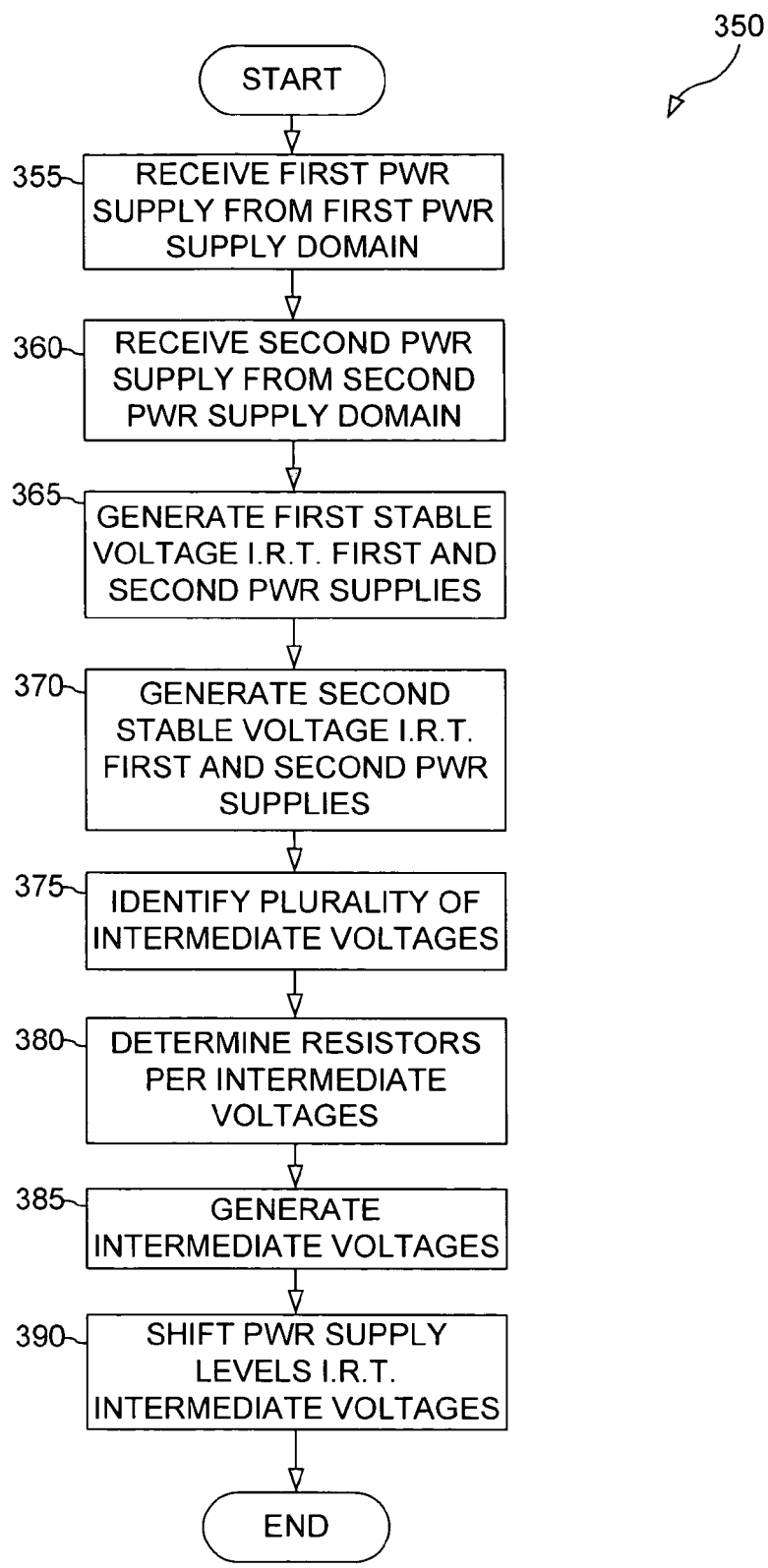
FIG. 3 is a flow diagram depicting a method for minimizing duty cycle error due to voltage differences across power domains.

FIG. 3 depicts a flow diagram 350 illustrating a method for providing intermediate power supply levels. The process begins at step 355 wherein a first stable voltage module and a second stable voltage module receive a first power supply from a first power supply domain. Stable voltage modules 210 and 212 of FIG. 2, for example, can perform this step.

At next step 360, the first of the series of level shifters receives second power supply from a second power supply domain. Level shifter 300 of FIG. 2, for example, can perform this step. At next step 365, the first stable voltage module generates a first stable voltage in response to the received first and second power supplies. Stable voltage module 210 of FIG. 2, for example, can perform this step.

At next step 370, the second stable voltage module generates a second stable voltage in response to the received first and second power supplies. Stable voltage module 212 of FIG. 2, for example, can perform this step. At next step 375, a plurality of intermediate voltage levels is determined in response to the received first and second stable voltages. This step can comprise a set of predetermined intermediate voltages established at the design or manufacturing stage of development of the system in which the steps of the method is employed, as one skilled in the art will understand.

At next step 380, appropriate resistance values are determined based on the determined intermediate voltage levels. Similar to step 375, this step can comprise a set of predetermined values established at the design or manufacturing stage of development of the system in which the steps of the method is employed, as one skilled in the art will understand.

At next step 385, the level shifter system generates intermediate voltages in response to the first and second stable voltages and the determined intermediate voltages. The first and second set of resistors and set of capacitors of FIG. 2, for example, can perform this step.

At next step 390, the series of level shifters receive the intermediate voltages and input from the preceding level shifter. The level shifters generate output in response to the received intermediate voltage input and the process ends. The series of level shifters 300, 302, 304, through 306 of FIG. 2, for example, can perform this step.

Thus, the above circuits and method provide a system/method to reduce duty cycle distortion introduced by transitions between power supply domains. Spreading the power supply domain voltage differences over many intermediate levels reduces the duty cycle distortion associated with a large process, voltage, and temperature ("PVT") transitions. Additionally, the present invention allows isolation between the initial power supply domain and the target power supply domain while generating the intermediate voltages. Moreover, the present invention allows for trimming of resistors to select the appropriate intermediate voltages for the desired output duty cycle, which allows for greater flexibility in the manufacturing process.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A system, comprising:
    a first stable voltage module configured to receive a first power supply and to generate a first stable voltage in response to the received first power supply;
    a second stable voltage module configured to receive the first power supply and to generate a second stable voltage in response to the received first power supply;
    a first set of resistors coupled to the first stable voltage module, wherein each resistor in the first set of resistors is coupled to the first stable voltage module and a capacitor in a set of capacitor; and
    a second set of resistors coupled to the second stable voltage module, wherein each resistor in the second set of resistors is coupled to second stable voltage module and a level shifter of a plurality of level shifters;
    wherein the set of capacitors is coupled to the first set of resistors and the second set of resistors.

2. The system as recited in claim 1, wherein the first stable voltage module comprises:
    a first resistor coupled to the first power supply;
    a second resistor coupled to the first resistor and to ground;
    a first opamp coupled to the first resistor and the second resistor and the first power supply;
    a first switch coupled to the first opamp;
    a third resistor coupled to the first switch and the first opamp; and
    a fourth resistor coupled to the third resistor, the first opamp and to ground.

3. The system as recited in claim 2, wherein the second stable voltage module comprises:
    a fifth resistor coupled to the first power supply;
    a sixth resistor coupled to the fifth resistor and to ground;
    a second opamp coupled to the fifth resistor and the sixth resistor and the second power supply;
    a second switch coupled to the second opamp;
    a seventh resistor coupled to the second switch and the second opamp; and
    an eighth resistor coupled to the seventh resistor, the second opamp and to ground.

4. The system as recited in claim 2, wherein at least one of the third resistor of the first stable voltage module, the seventh resistor of the second stable voltage module, the first set of resistors, or the second set of resistors comprises one or more variable-type resistors.

5. The system as recited in claim 1, further comprising a plurality of unity gain buffers coupled between the second set of resistors and the level shifters.

6. A method for performing level shifting from a first voltage level associated with a first input voltage signal to a second voltage level associated with a second input voltage signal, comprising:
    generating, in a level shifter circuit, at least one stable voltage signal based on the first input voltage signal;
    providing the at least one stable voltage signal to a plurality of intermediate stages of the level shifter circuit, wherein each intermediate stage of the plurality of intermediate stages generates an intermediate voltage output signal having a voltage level between the first voltage level and the second voltage level; and
    outputting an output voltage signal at a voltage level corresponding to the second voltage signal based on the intermediate voltage output signals of the plurality of intermediate stages, wherein generating at least one stable voltage signal based on the first input voltage signal comprises:
    inputting the first input voltage signal to a first stable voltage module to generate a first stable voltage output to each of the plurality of intermediate stages;
    inputting the first input voltage signal to a second stable voltage module to generate a second stable voltage output to each of the plurality of intermediate stages;
    providing the first stable voltage output signal to a first set of resistors, each intermediate stage comprising at least one resistor in the first set of resistors; and
    providing the second stable voltage output signal to a second set of resistors, each intermediate stage comprising at least one resistor in the second set of resistors.

7. The method as recited in claim 6, further comprising providing an output signal from each resistor in the second set of resistors to a corresponding unity gain buffer in a plurality of unity gain buffers coupled to the second set of resistors.

8. The method as recited in claim 6, wherein the step of generating a first stable voltage comprises:
    providing the first voltage signal from a first power supply to a first resistor;
    providing an output from the first resistor to a second resistor coupled to the first resistor and to ground;
    providing an output from the first resistor to a first opamp coupled to the first resistor and the second resistor and the first power supply;
    providing an output from the first opamp to a first switch coupled to the first opamp;
    providing an output of the first switch to a third resistor coupled to the first switch and the first opamp; and providing an output of the third resistor to a fourth resistor coupled to the third resistor, the first opamp and to ground, wherein the first switch is configured to generate the first stable voltage.

9. The method as recited in claim 8, wherein the step of generating a second stable voltage comprises:
providing the first voltage signal from the first power supply to a fifth resistor;
providing an output from the fifth resistor to a sixth resistor coupled to the fifth resistor and to ground;
providing an output from the sixth resistor to a second opamp coupled to the fifth resistor and the sixth resistor and the second power supply;
providing an output from the second opamp to a second switch coupled to the second opamp;
providing an output from the second switch to a seventh resistor coupled to the second switch and the second opamp; and
providing an output from the seventh resistor to an eighth resistor coupled to the seventh resistor, the second opamp and to ground, wherein the second switch is configured to generate the second stable voltage.

10. The method of claim 6, further comprising:
providing an output from each resistor in the first set of resistors to a corresponding resistor in the second set of resistors.

11. The method of claim 6, wherein at least one of the first set of resistors or the second set of resistors is comprised of variable-type resistors.

12. The method of claim 11, further comprising:
adjusting resistances of the variable-type resistors in at least one of the first set of resistors or the second set of resistors to reduce duty cycle distortion at the plurality of intermediate stages.

13. The method of claim 6, wherein each intermediate stage of the plurality of intermediate stages has a level shifter, and wherein the level shifters of the plurality of intermediate stages are coupled in series such that a first intermediate voltage output signal is generated by a level shifter of a first intermediate stage based on the second input voltage signal and each subsequent level shifter of the plurality of intermediate stages outputs an intermediate voltage output signal based on an input from a level shifter in a previous intermediate stage.

14. An apparatus for performing level shifting from a first voltage level associated with a first input voltage signal to a second voltage level associated with a second input voltage signal, comprising:
at least one stable voltage module that generates at least one stable voltage signal based on the first input voltage signal; and
a plurality of intermediate stages coupled to the at least one stable voltage module, wherein:
the at least one stable voltage signal is provided to the plurality of intermediate stages,
each intermediate stage of the plurality of intermediate stages generates an intermediate voltage output signal having a voltage level between the first voltage level and the second voltage level, and
an output voltage signal is output by the apparatus at a voltage level corresponding to the second voltage signal based on the intermediate voltage output signals of the plurality of intermediate stages, wherein the at least one stable voltage module comprises a first stable voltage module and a second stable voltage module, and wherein:
the first input voltage signal is input to the first stable voltage module to generate a first stable voltage output to each of the plurality of intermediate stages,
the first input voltage signal is input to the second stable voltage module to generate a second stable voltage output to each of the plurality of intermediate stages,
the first stable voltage output signal is output to a first set of resistors, each intermediate stage comprising at least one resistor in the first set of resistors, and
the second stable voltage output signal is output to a second set of resistors, each intermediate stage comprising at least one resistor in the second set of resistors.

15. The apparatus of claim 14, wherein an output from each resistor in the first set of resistors is provided to a corresponding resistor in the second set of resistors.

16. The apparatus of claim 14, wherein at least one of the first set of resistors or the second set of resistors is comprised of variable-type resistors.

17. The apparatus of claim 16, wherein resistances of the variable-type resistors in at least one of the first set of resistors or the second set of resistors are adjusted to reduce duty cycle distortion at the plurality of intermediate stages.

18. The apparatus of claim 14, wherein each intermediate stage of the plurality of intermediate stages has a level shifter, and wherein the level shifters of the plurality of intermediate stages are coupled in series such that a first intermediate voltage output signal is generated by a level shifter of a first intermediate stage based on the second input voltage signal and each subsequent level shifter of the plurality of intermediate stages outputs an intermediate voltage output signal based on an input from a level shifter in a previous intermediate stage.

* * * * *